(12) United States Patent
Nagashima et al.

(10) Patent No.: US 10,651,813 B2
(45) Date of Patent: May 12, 2020

(54) METHOD FOR DESIGNING FILTER

(71) Applicant: TOKYO ELECTRON LIMITED, Tokyo (JP)

(72) Inventors: Nozomu Nagashima, Miyagi (JP); Naohiko Okunishi, Miyagi (JP); Eiichiro Kikuchi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 312 days.

(21) Appl. No.: 15/627,592

(22) Filed: Jun. 20, 2017

(65) Prior Publication Data

US 2017/0373659 A1    Dec. 28, 2017

(30) Foreign Application Priority Data

Jun. 23, 2016    (JP) ................................. 2016-124468

(51) Int. Cl.
*G06F 17/50* (2006.01)
*H03H 7/01* (2006.01)

(52) U.S. Cl.
CPC ....... *H03H 7/0115* (2013.01); *G06F 17/5063* (2013.01)

(58) Field of Classification Search
USPC .............................................. 703/2, 19, 7, 1
See application file for complete search history.

(56) References Cited

U.S. PATENT DOCUMENTS

| | | | | |
|---|---|---|---|---|
| 6,313,587 B1 * | 11/2001 | MacLennan | .......... | H01J 61/025 315/224 |
| 6,858,112 B2 * | 2/2005 | Flamm | .................. | H01J 37/321 156/345.48 |
| 8,053,269 B2 * | 11/2011 | Tanaka | ................ | H01L 27/1288 438/69 |
| 8,409,905 B2 * | 4/2013 | Tanaka | ................ | H01L 27/1288 438/69 |
| 2010/0248405 A1 * | 9/2010 | Tanaka | ................ | H01L 27/1288 438/34 |
| 2011/0126765 A1 | 6/2011 | Yamazawa et al. | | |
| 2012/0028391 A1 * | 2/2012 | Tanaka | ................ | H01L 27/1288 438/34 |
| 2014/0231389 A1 * | 8/2014 | Nagami | ............ | H01J 37/32091 216/67 |
| 2015/0262793 A1 | 9/2015 | Okunishi et al. | | |
| 2017/0331453 A1 * | 11/2017 | Bergmann | ........... | H03H 9/0038 |

FOREIGN PATENT DOCUMENTS

| | | |
|---|---|---|
| JP | 2011-135052 A | 7/2011 |
| JP | 2015-173027 A | 10/2015 |

* cited by examiner

*Primary Examiner* — Thai Q Phan

(74) *Attorney, Agent, or Firm* — Rothwell, Figg, Ernst & Manbeck, P.C.

(57) ABSTRACT

A method is provided to design a filter. In the method, a difference between a high frequency to be blocked and a resonance frequency of a distributed constant type reference filter is obtained, the reference filter including a reference coil having windings wound at a plurality of pitches having the same length in an axial direction and a capacitor connected in parallel to the reference coil. When the difference is greater than the predetermined value, a split position in the reference coil where the reference coil is divided into a first coil element and a second coil element connected in series and a split distance between the first coil element and the second coil element to reduce the first difference.

8 Claims, 13 Drawing Sheets

| PITCH No. | VARIATION OF RESONANCE FREQUENCY (MHz) | | | |
|---|---|---|---|---|
| | 1st | 2nd | 3rd | 4th |
| 1 | 0.0 | −0.2 | −0.5 | −1.4 |
| 2 | 0.0 | −0.5 | −0.7 | −2.6 |
| ⋮ | ⋮ | ⋮ | ⋮ | ⋮ |
| N−1 | −0.2 | 0.5 | −1.0 | −2.1 |
| N | 0.0 | 0.2 | −0.5 | −0.9 |

METHOD FOR DESIGNING FILTER

CROSS-REFERENCE TO RELATED APPLICATIONS

This application claims priority to Japanese Patent Application No. 2016-124468 filed on Jun. 23, 2016, the entire contents of which are incorporated herein by reference.

FIELD OF THE INVENTION

The disclosure relates to a method for designing a filter.

BACKGROUND OF THE INVENTION

In manufacturing electronic devices such as semiconductor devices and the like, a plasma processing apparatus is used. The plasma processing apparatus generally includes a chamber main body, a mounting table and a high frequency power supply. An inner space of the chamber main body defines a chamber. The mounting table is provided in the chamber and includes a lower electrode and an electrostatic chuck. The high frequency power supply is connected to the lower electrode. In the plasma processing apparatus, a processing gas is supplied into the chamber and is excited, so that a target object mounted on the electrostatic chuck is processed.

Further, in the plasma processing apparatus, a heater may be embedded in the mounting table in order to control a temperature of the target object. The heater is connected to a heater controller having a power supply (AC power supply). In this plasma processing apparatus, a filter is installed between the heater and the heater controller in order to prevent a high frequency power supplied to the mounting table from entering the heater controller. Japanese Patent Application Publication Nos. 2011-135052 and 2015-173027 disclose techniques using a distributed constant type filter as the aforementioned filter.

The filter disclosed in Japanese Patent Application Publication No. 2011-135052 includes a coil, a capacitor, and a cylindrical conductor. The coil has windings wound at a plurality of pitches having the same length in an axial direction. In other words, the windings of the coil are wound at regular pitches. The coil is connected in parallel to the capacitor. The cylindrical conductor surrounds the coil. In frequency-impedance characteristics of the filter, impedance peaks occur at regular intervals in a frequency direction. In other words, the filter has a plurality of resonance frequencies.

As in the case of the filter disclosed in Japanese Patent Application Publication No. 2011-135052, the filter disclosed in Japanese Patent Application Publication No. 2015-173027 includes a coil, a capacitor, and a cylindrical conductor. In this filter, one or more pitches among a plurality of pitches provided by the windings of the coil in the axial direction are different from other pitches. In other words, the windings of the coil are wound at irregular pitches. By using this coil having the windings of irregular pitches, the filter can makes a specific resonance frequency among a plurality of resonance frequencies coincide with or close to a desired frequency.

As described above, a specific resonance frequency can be changed by replacing a coil having regular pitches with a coil having irregular pitches. However, a maximum value of variation of the resonance frequency which can be realized by replacing the coil having regular pitches with the coil having irregular pitches is limited. Therefore, when there is a large difference between the resonance frequency and the desired frequency, it is difficult to reduce such a large difference even by using the coil having irregular pitches.

SUMMARY OF THE INVENTION

In view of the above, the disclosure provides a method for designing a filter.

In accordance with an embodiment of the present disclosure, there is provided a method for designing a filter including: obtaining a difference between a high frequency to be blocked and a resonance frequency of a distributed constant type reference filter, which includes a reference coil having windings wound at a plurality of pitches having the same length in an axial direction and a capacitor connected in parallel to the reference coil; determining, when the difference is smaller than or equal to a predetermined value, one or more pitches to be changed in length, among the plurality of pitches, to reduce the difference; and determining, when the difference is greater than the predetermined value, a split position in the reference coil where the reference coil is divided into a first coil element and a second coil element connected in series and a split distance between the first coil element and the second coil element to reduce the difference.

A resonance frequency of the reference coil having regular pitches can be changed by replacing the reference coil with two coil elements connected in series and adjusting a distance between the two coil elements. Variation of the resonance frequency, which can be realized by replacing the reference coil having regular pitches with the two coil elements, are greater than variation of a resonance frequency, which can be realized by replacing the reference coil having regular pitches with a coil having irregular pitches. In accordance with the method of the present disclosure, when a difference between the resonance frequency of the reference filter and the high frequency to be blocked is smaller than or equal to a predetermined value, one or more pitches suitable for reduction of the difference are determined among a plurality of pitches. Accordingly, as a filter having a coil of irregular pitches, it becomes possible to design a filter whose specific resonance frequency has been finely adjusted on the basis of the reference filter having the reference coil of regular pitches. On the other hand, when the difference is greater than the predetermined value, the split position and the split distance in the reference coil, which are suitable for reduction of the difference, are determined. Therefore, it becomes possible to design the split filter having a coil whose specific resonance frequency has been remarkably adjusted on the basis of the reference filter having the reference coil of regular pitches. Accordingly, in accordance with the above-described method, even if a large difference exists between the specific resonance frequency and a desired frequency, the difference can be reduced or eliminated.

The one or more pitches may be determined to minimize the difference by referring to a table in which variations of a plurality of resonance frequencies of the reference filter according to changes in length of the respective pitches are registered. Further, the split position and the split distance may be determined to minimize the difference by using a prepared relationship of respective resonance frequencies of a filter, which includes the first coil element and the second coil element connected in series and the capacitor connected in parallel to the first coil element and the second coil element, with respect to a position in the reference coil where the reference coil is divided into the first coil element and the second coil element and a distance between the first coil element and the second coil element.

The method described above further includes determining one or more other pitches to be changed in length, among a plurality of pitches in the axial direction provided by windings of a coil including the first coil element and the second coil element, to reduce an additional difference between the high frequency and a resonance frequency of a filter including the first coil element and the second coil element connected in series and the capacitor connected in parallel to the first coil element and the second coil element. With such configuration, even when there is a difference (i.e., the additional difference) between a desired frequency and a resonance frequency of the filter in which the reference coil is replaced with the first coil element and the second coil element, the difference can be reduced or eliminated. Further, the one or more other pitches may be determined by referring to the table to minimize the additional difference.

Further, a high frequency power having the high frequency may be supplied to a lower electrode of a mounting table of a plasma processing apparatus. Further, the filter designed by the method may block the high frequency between a heater installed in the mounting table and a heater controller including a power supply connected to the heater.

As described above, even when there is a large difference between a desired frequency and a resonance frequency of the filter, the difference can be reduced or eliminated.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
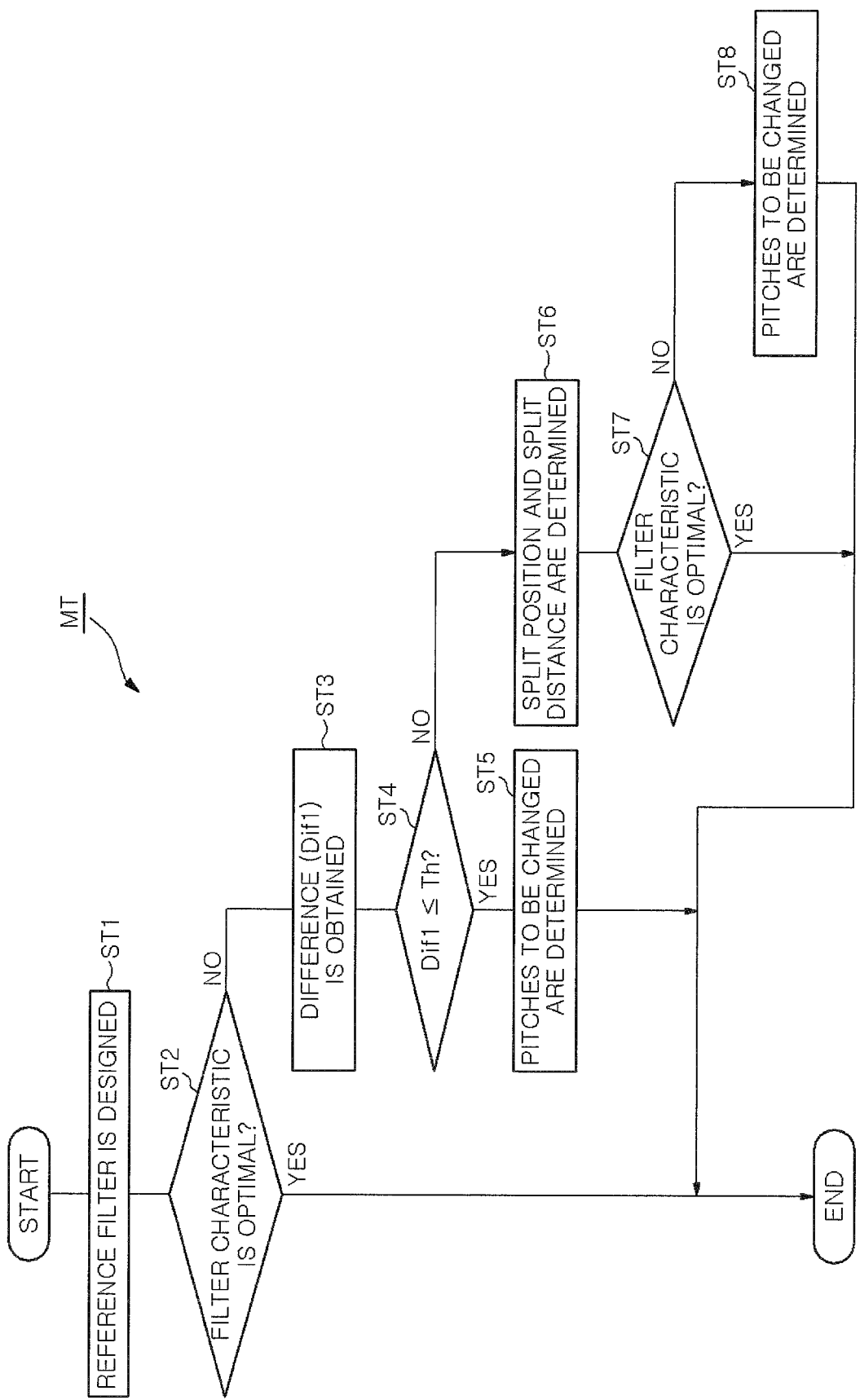
FIG. 1 is a flowchart showing a method for designing a filter according to an embodiment.

Hereinafter, embodiments will be described in detail with reference to the accompanying drawings. Like reference numerals will be given to like or corresponding parts throughout the drawings.

FIG. 1 is a flowchart showing a method for designing a filter according to an embodiment. A method MT shown in FIG. 1 is a method for designing a filter for blocking a high frequency. For example, the filter designed by the method MT is used in a plasma processing apparatus and used to block a high frequency that may flows into a heater controller, which is connected to a heater through a power feed line.

Figure 2:
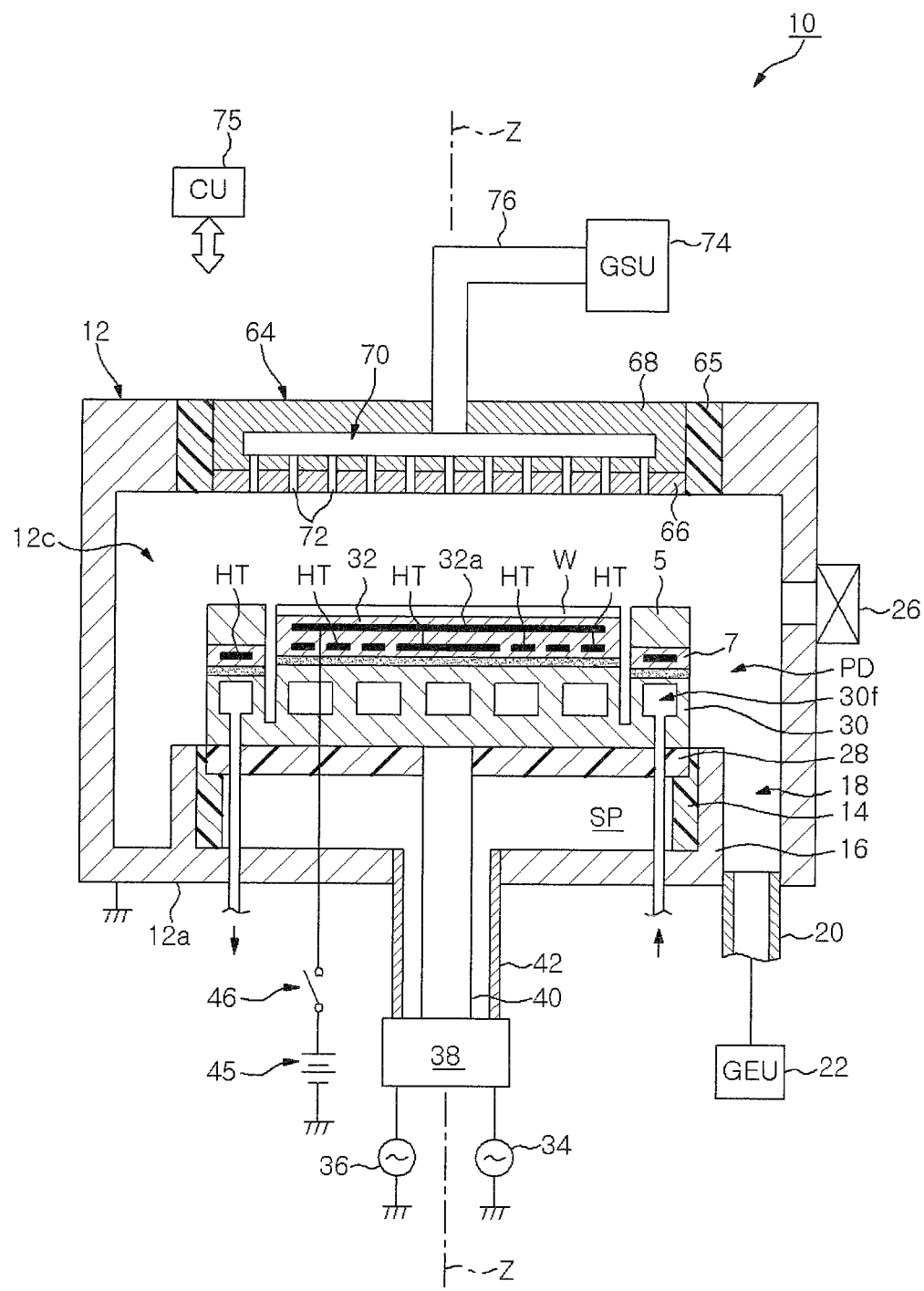
FIG. 2 schematically shows an example of a plasma processing apparatus.

FIG. 2 schematically shows an example of a plasma processing apparatus. A plasma processing apparatus 10 shown in FIG. 2 is a capacitively coupled plasma processing apparatus. The plasma processing apparatus 10 includes a chamber main body 12. The chamber main body 12 has a substantially cylindrical shape. An inner space of the chamber main body 12 defines a chamber 12c. The chamber main body 12 is made of, e.g., aluminum or stainless steel, and frame-grounded. An opening for loading and unloading a target object W is formed at a sidewall of the chamber main body 12. The target object W may be a disk-shaped plate made of, e.g., silicon. A gate valve 26 for opening/closing the opening is attached to the sidewall of the chamber main body 12.

A mounting table PD is provided in the chamber 12c. The target object W is mounted on the mounting table PD. The mounting table PD is supported by a support 14. The support 14 has a substantially cylindrical shape and extends upward from a bottom wall 12a of the chamber main body 12. The support 14 is made of a dielectric material such as ceramic. The mounting table PD and the support 14 are coupled so that airtightness in the space in the chamber main body 12 is ensured. A bottom surface of the mounting table PD and an inner wall of the support 14 define a space SP communicating with an atmospheric space outside the chamber main body 12.

The chamber main body 12 provides a supporting portion 16. The supporting portion 16 extends upward from the bottom wall 12a of the chamber main body 12 along an outer periphery of the support 14. A gas exhaust passageway 18 is formed between the supporting portion 16 and the inner wall of the chamber main body 12. The gas exhaust passageway 18 is connected to a gas exhaust line 20. The gas exhaust line 20 is connected to a gas exhaust unit (GEU) 22. The gas exhaust unit 22 performs evacuation and depressurization of the chamber 12c and includes a pressure controller and a vacuum pump such as a turbo molecular pump.

Figure 3:
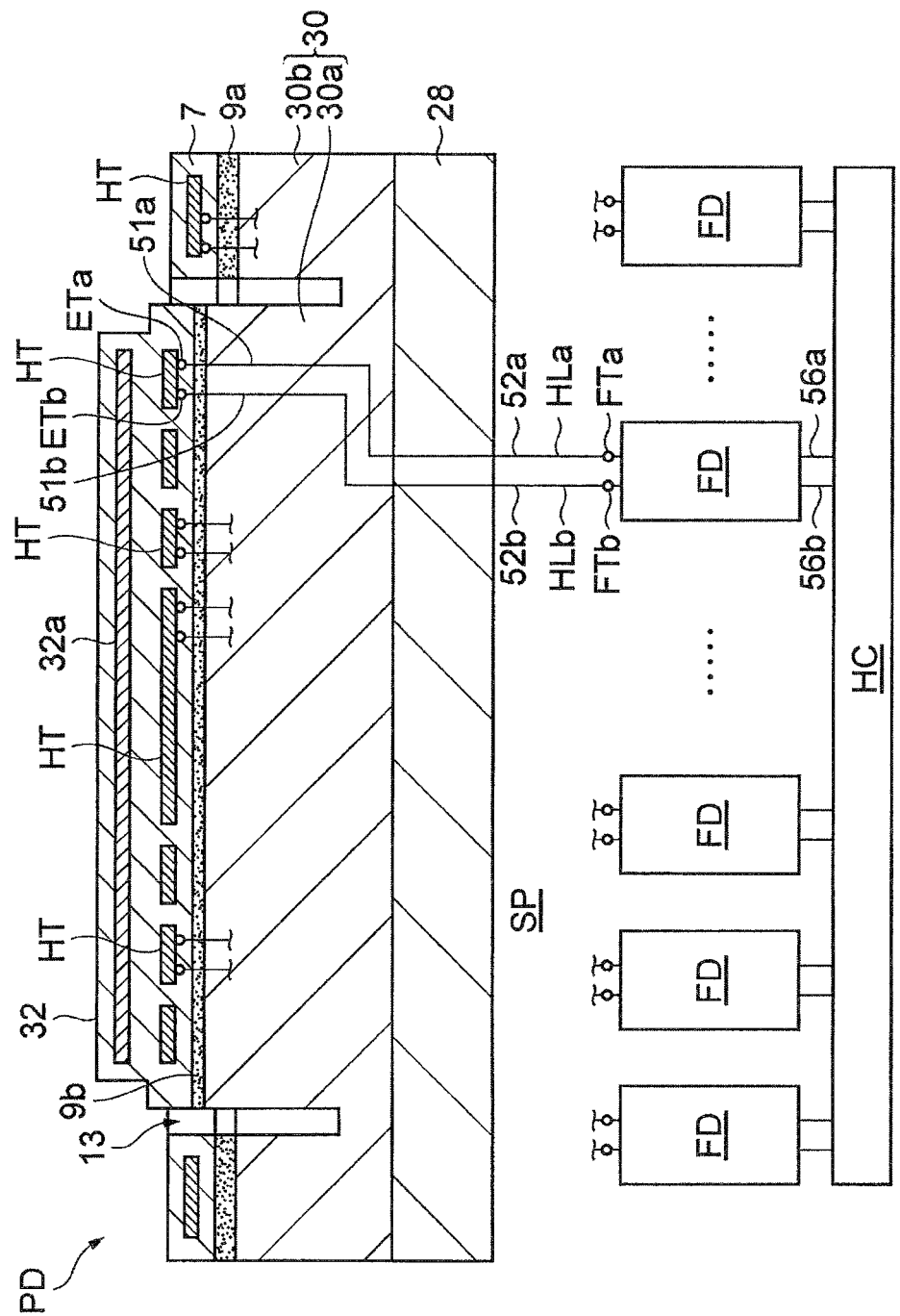
FIG. 3 is an enlarged cross sectional view of a mounting table in the plasma processing apparatus shown in FIG. 2.

FIG. 3 is an enlarged cross sectional view of the mounting table of the plasma processing apparatus shown in FIG. 2. In FIG. 3, a filter device FD and a heater controller HC are illustrated together with the mounting table PD. In FIG. 3, a coolant path to be described later is not illustrated. Hereinafter, the descriptions will be made with reference to FIGS. 2 and 3. The mounting table PD includes a back plate 28, a lower electrode 30, and an electrostatic chuck 32. The back plate 28 has a substantially disk shape and is made of a dielectric material such as ceramic. The lower electrode 30 is provided on the back plate 28. The lower electrode 30 has a substantially disk shape and is made of a conductor such as aluminum. The electrostatic chuck 32 attracts and holds the target object W thereon by an electrostatic force and is installed on the lower electrode 30.

A first high frequency power supply 34 and a second high frequency power supply 36 are connected to the lower electrode 30 via a matching unit 38 and a power feed rod 40. The first high frequency power supply 34 outputs a first high frequency power mainly contributing to plasma generation. The frequency of the first high frequency power is, e.g., 100 MHz. The second high frequency power supply 36 outputs a second high frequency power mainly contributing to attraction of ions to the target object W. The frequency of the second high frequency power is, e.g., 13 MHz, which is lower than that of the first high frequency power. The matching unit 38 includes a matcher for matching an impedance between a plasma load and each of the first and the second high frequency power supply 34 and 36.

The power feed rod 40 is a cylindrical or columnar conductor. An upper end of the power feed rod 40 is connected to a central portion of a bottom surface of the lower electrode 30. A lower end of the power feed rod 40 is connected to the matcher in the matching unit 38. A cylindrical conductor cover 42 is installed around the power feed rod 40. More specifically, an opening having a diameter greater than a diameter of the power feed rod 40 is formed at the bottom wall 12a. An upper end portion of the conductor cover 42 is coupled to the edge of the opening of the bottom wall 12a. The conductor cover 42 is connected to a ground terminal of the matching unit.

A flow path 30f is formed in the lower electrode 30. The flow path 30f is supplied with a coolant from a chiller unit installed at the outside of the chamber main body 12. The coolant supplied to the flow path 30f returns to the chiller unit. A gas line for supplying a heat transfer gas, e.g., He gas, to a gap between the target object W and the electrostatic chuck 32 may be provided in the mounting table PD.

A groove 13 is formed at a top surface of the lower electrode 30. The groove 13 extends in a circumferential direction with respect to an axis Z. The axis Z extends in a vertical direction through the center of the mounting table PD. The axis Z substantially coincides with a central axis of the chamber main body 12. The groove 13 may be an annular groove extending about the axis Z. Further, the groove 13 may be extended discontinuously in the circumferential direction. The groove 13 divides the upper portion of the lower electrode 30 into an inner portion 30a including the axis Z and an outer portion 30b extending outside the inner portion 30a. The inner portion 30a is a substantially circular region when seen from the top. The outer portion 30b is a substantially annular region when seen from the top.

The inner portion 30a of the lower electrode 30 provides a substantially circular top surface. The electrostatic chuck 32 is installed on the top surface of the inner portion 30a through an adhesive 9b. The electrostatic chuck 32 has a substantially disk shape and has a layer made of a dielectric material such as ceramic. The electrostatic chuck 32 further includes an electrode 32a as an inner layer of the layer made of a dielectric material. A power supply 45 is connected to the electrode 32a through a switch 46. When a voltage, e.g., a DC voltage, from the power supply 45 is applied to the electrode 32a, the electrostatic chuck 32 generates an electrostatic force. The target object W is attracted and held on the electrostatic chuck 32 by the electrostatic force.

The outer portion 30b of the lower electrode 30 provides a substantially annular top surface. A focus ring 5 is installed on the top surface of the outer portion 30b through a spacer member 7. The spacer member 7 is an annular member and installed on the outer portion 30b of the lower electrode 30 through an adhesive 9a. The spacer member 7 is made of, e.g., a dielectric material such as ceramic or the like. The focus ring 5 is a circular ring-shaped member and made of a material, e.g., silicon or quartz, which is suitable for a process to be performed. The focus ring 5 extends to surround an edge of the electrostatic chuck 32 and an edge of the target object W.

The mounting table PD includes a plurality of heaters HT, i.e., resistance heating elements. The heaters HT are installed in the electrostatic chuck 32. For example, the electrostatic chuck 32 has a plurality of regions concentric with respect to the axis Z. One or more heaters are installed in each of the regions. A part of the heaters HT may be installed in the spacer member 7. Each of the heaters HT is connected to the heater controller HC through a corresponding one of a plurality of filter devices FD. The filter devices FD and the heater controller HC are installed at the outside of the chamber main body 12. The filter devices FD may be attached to the bottom wall 12a of the chamber main body 12.

As shown in FIG. 2, a shower head 64 is installed at a ceiling portion of the chamber main body 12. The shower head 64 is supported at the ceiling portion of the chamber main body 12 through a supporting member 65. The shower head 64 serves as an upper electrode.

The shower head 64 includes an electrode plate 66 and a holding body 68. The electrode plate 66 has a substantially circular disk shape and made of, e.g., Si or SiC. A bottom surface of the electrode plate 66 faces the chamber 12c. The holding body 68 holds the electrode plate from above. The holding body 68 is made of, e.g., aluminum, and an alumite film is formed on the surface thereof. A gas diffusion space 70 is provided in the holding body 68. A plurality of gas injection holes 72 extending through the holding body 68 and the electrode plate 66 is connected to the gas diffusion space 70. A gas supply line 76 is connected to the gas diffusion space 70. The gas supply line 76 is connected to a gas supply unit (GSU) 74 configured to supply a processing gas.

The plasma processing apparatus 10 further includes a control unit (CU) 75. The control unit 75 includes, e.g., a microcomputer. The respective components of the plasma processing apparatus 10, e.g., the gas exhaust unit 22, the first high frequency power supply 34, the second high frequency power supply 36, the switch 46, the heater controller HC, the chiller unit, the gas supply unit 74 and the like, are controlled by the control unit 75.

In the plasma processing apparatus 10, when etching is performed, the gate valve 26 is opened and the target object W is loaded into the chamber 12c and mounted on the electrostatic chuck 32. An etching gas is supplied at a predetermined flow rate from the gas supply unit 74 to the chamber 12c. A pressure in the chamber 12c is decreased by the gas exhaust unit 22. A first high frequency power and a second high frequency power are supplied from the first high frequency power supply 34 and the second high frequency power supply 36 to the lower electrode 30, respectively. The heat transfer gas (He gas) is supplied from the heat transfer gas supply unit to a contact interface between the electrostatic chuck 32 and the target object W. The coolant is supplied to the flow path 30f in the lower electrode 30. An AC output from the heater controller HC is applied to the heaters HT and controlled such that temperature distribution in the mounting table PD becomes pre-set temperature distribution. The gas injected from the shower head 64 is excited by a high frequency electric field in the chamber main body 12. A film of the target object W is etched by active species generated by excitation of the gas.

Figure 4:
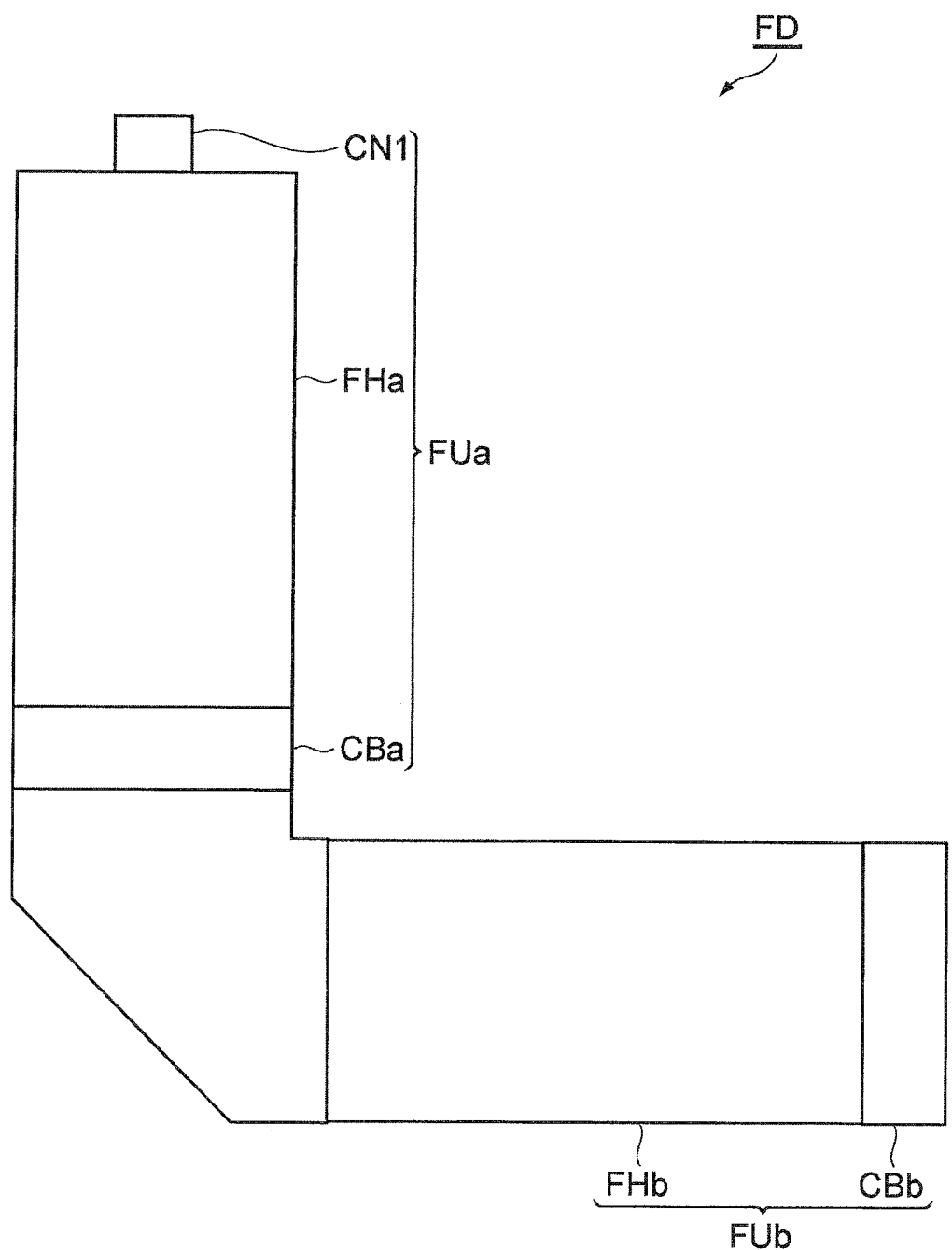
FIG. 4 is a side view showing an external appearance of a filter device according to the embodiment.
Figure 5:
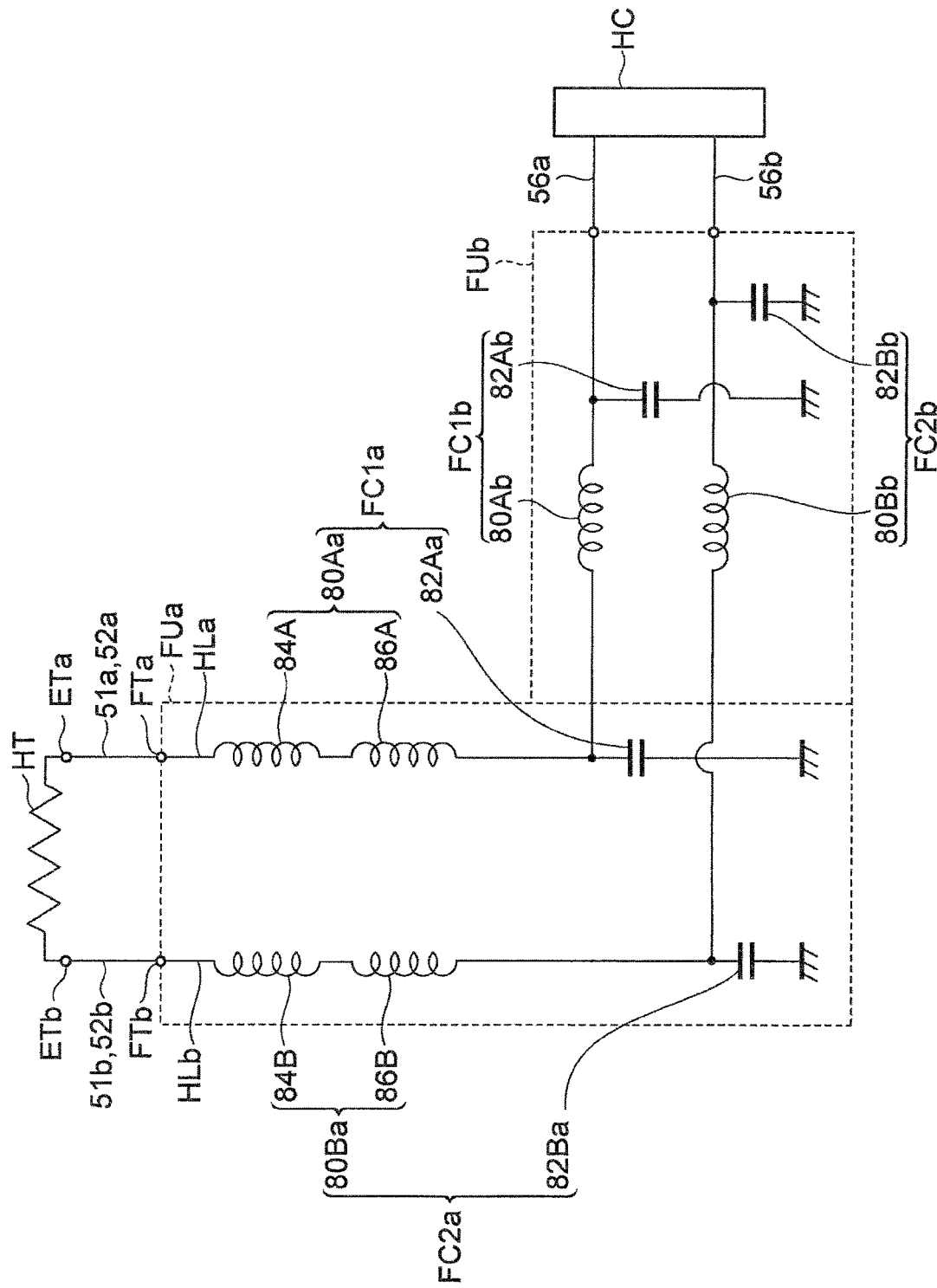
FIG. 5 shows a filter circuit installed in the filter device according to the embodiment.
Figure 6:
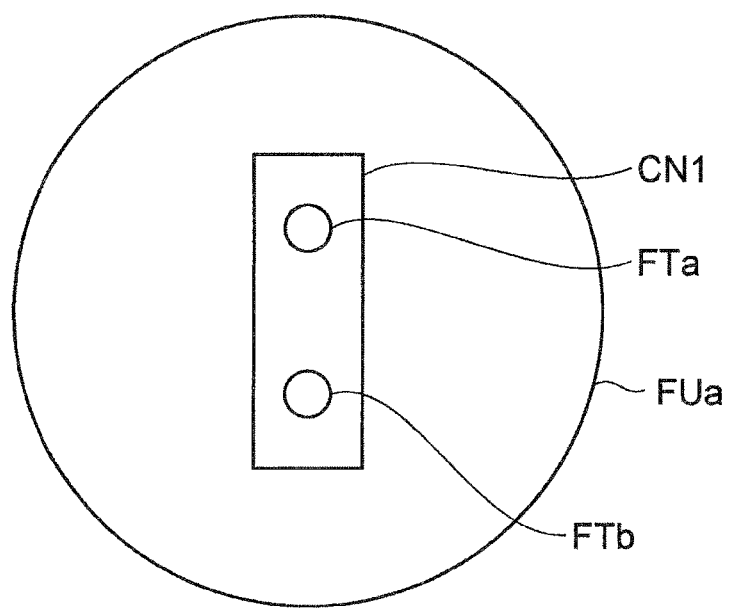
FIG. 6 is a plan view showing a first connector of the filter device according to the embodiment.

Each of the filter devices FD includes a filter for preventing or suppressing intrusion of a part of the high frequency power supplied to the lower electrode 30 into the heater controller HC through a power feed line between a corresponding heater HT and the heater controller HC. The filter devices FD have substantially the same configuration. Hereinafter, a single heater HT and a single filter device FD connected to the single heater HT will be described with reference to FIGS. 3 to 6. FIG. 4 is a side view showing an external appearance of a filter device according to the embodiment. FIG. 5 shows a filter circuit installed in the filter device according to the embodiment. FIG. 6 is a plan view showing a first connector of the filter device according to the embodiment;

As shown in FIG. 3, the heater HT includes a first terminal Eta and a second terminal ETb. The first terminal Eta is connected to a first output terminal of the heater controller HC through a first power feed line HLa. The second terminal ETb is connected to a second output terminal of the heater controller HC through a second power feed line HLb. The heater controller HC includes an AC output power supply and a power supply for performing a switching (ON/OFF) operation of a commercial frequency by using, e.g., a solid state relay. The heater controller HC is connected to the heater HT by a closed loop circuit. A current outputted by the heater controller HC flows toward the heater HT through the first power feed line HLa in a positive cycle. Accordingly, Joule heat is generated by the heater HT. The current flowing toward the heater HT in the positive cycle returns to the heater controller HC through the second power feed line HLb. On the other hand, in a negative cycle, the current outputted by the heater controller HC flows toward the heater HT through the second power feed line HLb. The current flowing toward the heater HT in the negative cycle returns to the heater controller HC through the first power feed line HLa.

As shown in FIGS. 3 and 5, the first power feed line HLa includes conductors 51a and 52a, a coil of the filter device FD, and a cable 56a. The conductor 51a is installed in the mounting table PD. The conductor 52a passes through the space SP. The first terminal Eta of the heater HT is connected to the first terminal FTa of the filter device FD through the conductors 51a and 52a. The first terminal FTa of the filter device FD is connected to the cable 56a through the coil of the filter device FD. The cable 56a is connected to the first output terminal of the heater controller HC.

The second power feed line HLb includes conductors 51b and 52b, another coil of the filter device FD, and a cable 56b. The conductor 51b is installed in the mounting table PD and the conductor 52b passes through the space SP. The second terminal ETb of the heater HT is connected to the second terminal FTb of the filter device FD through the conductors 51b and 52b. The second terminal FTb of the filter device ED is connected to the cable 56b through the another coil of the filter device FD. The cable 56b is connected to the second output terminal of the heater controller HC.

In one embodiment, the filter device FD includes a first filter unit FUa and a second filter unit FUb. The first filter unit FUa has a first filter FC1a and a second filter FC2a for blocking the first high frequency. The first filter FC1a is installed in the first power feed line HLa. The second filter FC2a is installed in the second power feed line HLb.

The first filter FC1a has a coil 80Aa and a capacitor 82Aa. The coil 80Aa constitutes a part of the first power feed line HLa. One end of the coil 80Aa is connected to the first terminal FTa. The other end of the coil 80Aa is connected to one end of the capacitor 82Aa. The other end of the capacitor 82Aa is connected to the ground. The coil 80Aa may include a first coil element 84A and a second coil element 86A. The first coil element 84A and the second coil element 86A are connected in series between the first terminal FTa and a first filter FC1b and connected in parallel to the capacitor 82Aa.

The second filter FC2a includes a coil 80Ba and a capacitor 82Ba. The coil 80Ba constitutes a part of the second power feed line HLb. One end of the coil 80Ba is connected to the second terminal FTb. The other end of the coil 80Ba is connected to one end of the capacitor 82Ba. The other end of the capacitor 82Ba is connected to the ground. The coil 80Ba may include a first coil element 84B and a second coil element 86B. The first coil element 84B and the second coil element 86B are connected in series between the second terminal FTb and a second filter FC2b and connected in parallel to the capacitor 82Ba.

The second filter unit FUb includes the first filter FC1b and the second filter FC2b for blocking the second high frequency. The first filter FC1b is installed in the first power feed line HLa. The second filter FC2b is installed in the second power feed line HLb.

The first filter FC1b includes a coil 80Ab and a capacitor 82Ab. The coil 80Ab constitutes a part of the first power feed line HLa. One end of the coil 80Ab is connected to a node between the coil 80Aa and the capacitor 82Aa. The other end of the coil 80Ab is connected to one end of the capacitor 82Ab. The other end of the capacitor 82Ab is connected to the ground. Further, the other end of the coil 80Ab is connected to the first output terminal of the heater controller HC. The coil 80Ab may include a first coil element and a second coil element connected in series.

The second filter FC2b includes a coil 80Bb and a capacitor 82Bb. The coil 80Bb constitutes a part of the second power feed line HLb. One end of the coil 80Bb is connected to a node between the coil 80Ba and the capacitor 82Ba. The other end of the coil 80Bb is connected to one end of the capacitor 82Bb. The other end of the capacitor 82Bb is connected to the ground. Further, the other end of the coil 80Bb is connected to a second output terminal of the heater controller HC. The coil 80Bb may include a first coil element and a second coil element connected in series.

As shown in FIG. 4, the first filter unit FUa includes a frame FHa and a capacitor box CBa. The frame FHa has conductivity and is connected to the ground. The frame FHa has therein the coils 80Aa and 80Ba. The capacitor box CBa is coupled to the frame FHa and has therein the capacitors 82Aa and 82Ba. Further, the frame FHa is coupled to the first connector CN1. As shown in FIG. 6, the first connector CN1 provides a first terminal FTa and a second terminal FTb.

The second filter unit FUb includes a frame FHb and a capacitor box CBb. The frame FHb has conductivity and is connected to the ground. The frame FHb has therein the coils 80Ab and 80Bb. The capacitor box CBb is coupled to the frame FHb and has therein the capacitors 82Ab and capacitor 82Bb.

Figure 7:
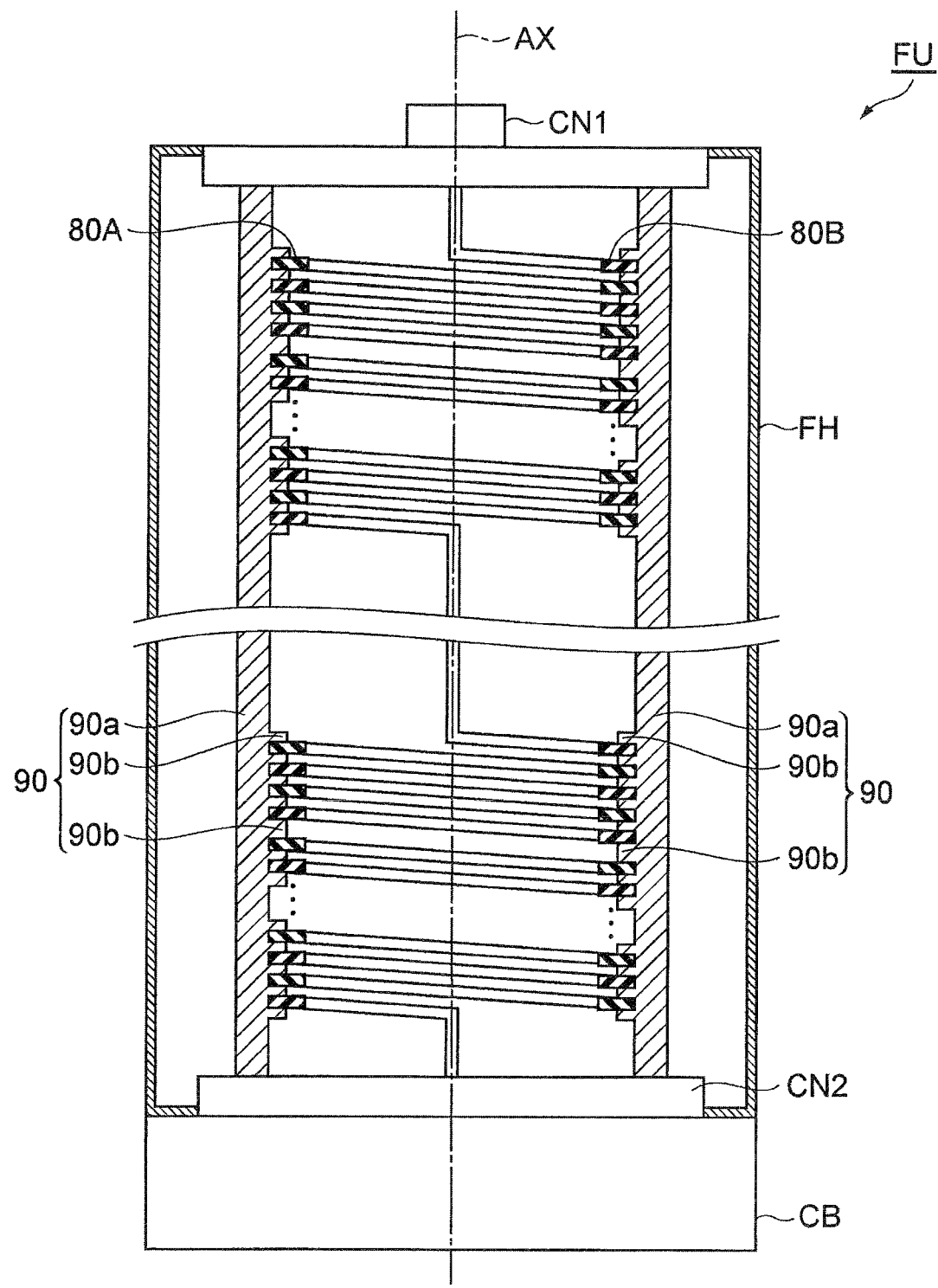
FIG. 7 is a cross sectional view of a filter unit.

Hereinafter, a physical configuration of a filter unit FU which may be employed as one or both of the first filter unit FUa and the second filter unit FUb will be described. FIG. 7 is a cross sectional view of the filter unit. The filter unit FU shown in FIG. 7 includes coils 80A and 80B. The coil 80A corresponds to the coil 80Aa of the first filter unit FUa and the coil 80Ab of the second filter unit FUb. The coil 80B corresponds to the coil 80Ba of the first filter unit FUa and the coil 80Bb of the second filter unit FUb.

The filter unit FU further includes a frame FH, a capacitor box CB, the first connector CN1, and a second connector CN2. The frame FH corresponds to the frame FHa of the first filter unit FUa and the frame FHb of the second filter unit FUb. The frame FH has conductivity and is made of, e.g., aluminum. The frame FH has, e.g., a substantially cylindrical shape. A central axis of the frame FH substantially coincides with the axis AX. The frame FH has therein the coils 80A and 80B.

One end of the coil 80A and one end of the coil 80B are supported by the first connector CN1. The other end of the coil 80A and the other end of the coil 80B are supported by the second connector CN2. One end of the coil 80A is connected to a terminal provided by the first connector CN1, which may be the first terminal FTa in the first filter unit FUa. One end of the coil 80B is connected to another terminal provided by the first connector CN1, which may be the second terminal FTb in the first filter unit FUa.

The capacitor box CB corresponds to the capacitor box CBa of the first filter unit FUa and the capacitor box CBb of the second filter unit FUb. The capacitor box CB is coupled to the frame FH. The capacitor box CB includes therein two capacitors. One of the two capacitors corresponds to the capacitor 82Aa of the first filter unit FUa and the capacitor 82Ab of the second filter unit FUb and is connected between the other end of the coil 80A and the ground. The other one of the two capacitors corresponds to the capacitor 82Ba of the first filter unit FUa and the capacitor 82Bb of the second filter unit FUb and is connected between the other end of the coil 80B and the ground.

The coils 80A and 80B are air core coils and have winding. Each of the windings of the coils 80A and 80B may have, e.g., a rectangular cross-sectional shape. Further, each of the windings of the coils 80A and 80B may be a bare wire or may have an insulating film covering a surface of a winding conductor.

The coils 80A and 80B are concentrically arranged with respect to the axis AX. The windings of the coil 80A are wound around the axis AX in a screw shape and provide a plurality of turns along the axial direction (extension direction of the axis AX). The coil 80A provides a plurality of pitches between the windings (or turns) in the axial direction. The windings of the coil 80B are wound around the axis AX in a screw shape. The windings of the coils 80B and the windings of the coil 80A are alternately wound. The windings of the coil 80B provide a plurality of turns along the axial direction. The coil 80B provides a plurality of pitches between the windings (or turns) in the axial direction.

As described above, the coils 80A and 80B are surrounded by the frame FH. The coils 80A and 80B and the frame FH constitute a distributed constant line. The coil 80A and one of the two capacitors constitute a single filter. The coil 80B and the other one of the two capacitors constitute another single filter. In other words, the filter unit FU includes two distributed constant type filters. Each of the two filters of the filter unit FU has frequency-impedance characteristics, the frequency including a plurality of resonance frequencies. In other words, each of the two filters of the filter unit FU has impedance peaks at the resonance frequencies.

A plurality of resonance frequencies is specified by an inductance per unit length of the coil (the coil 80A or 80B) and an electrostatic capacity per unit length. An inter-wiring capacitance per unit length is specified by an electrostatic capacity of a capacitor connected to the coil, an electrostatic capacity between the frame FH and the coil, and an electrostatic capacity between the windings (or turns) of the coil.

Figure 8:
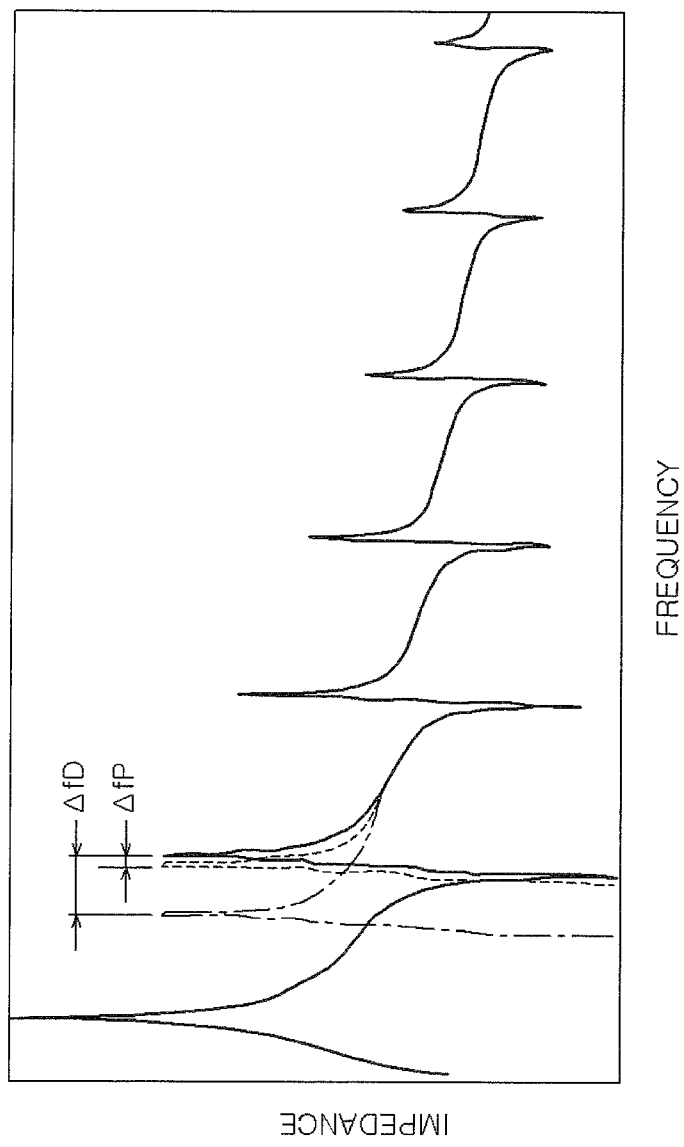
FIG. 8 shows an example of frequency-impedance characteristics of a filter.

FIG. 8 shows an example of frequency-impedance characteristics of the filter. When a plurality of pitches of the coil have the same length, a plurality of resonance frequencies have regular intervals, as indicated by a solid line in FIG. 8. When one or more pitches among the plurality of pitches of the coil have lengths different from those of the other pitches, a specific resonance frequency among a plurality of resonance frequencies becomes different from a corresponding resonance frequency among a plurality of resonance frequencies having regular intervals, as indicated by a dotted line in FIG. 8. When the coil is divided into two coil elements connected in series and a distance (split distance) exists between the two coil elements, a specific resonance frequency among a plurality of resonance frequencies becomes considerably different from a corresponding resonance frequency among a plurality of resonance frequencies having regular intervals, as indicated by a dashed dotted line in FIG. 8. As will be described later, in the method MT, one or more pitches to be changed in length among a plurality of pitches of the coil, and/or a split position of the coil and the split distance between the two coil elements are determined to reduce the difference between the specific resonance frequency and the high frequency to be blocked.

As shown in FIG. 7, the filter unit FU includes a plurality of comb-shaped members 90 in order to configure the coil (coils 80A and 80B) having a plurality of pitches and/or the split position and the split distance determined by the method MT. In the example shown in FIG. 7, the filter unit FU has two comb-shaped members 90. The comb-shaped members 90 may be made of an insulator, e.g., resin such as PEEK or PCTFE. Each of the comb-shaped members 90 has a cylindrical shaft 90a and a plurality of teeth 90b. The shaft 90a extends substantially in parallel to the axis AX. One end of the shaft 90a is fixed to the first connector CN1. The other end of the shaft 90a is fixed to the second connector CN2. Each of the teeth 90b has a thin plate shape and extends in a direction crossing with or substantially perpendicular to the axis AX toward the axis AX from the inner surface of the shaft 90a. The comb-shaped member 90 provides slots between the adjacent teeth 90b in the axial direction. In other words, the comb-shaped member 90 provides a plurality of slots arranged along the axial direction. The windings of the coil 80A and the windings of the coil 80B are inserted into the slots provided by the comb-shaped member 90. Accordingly, the pitches of the coil 80A and the pitches of the coils 80B, and/or the split positions and the split distances of the coils 80A and 80B are specified.

Hereinafter, referring back to FIG. 1, the method MT will be described in detail. The two filters of the filter unit FU have substantially the same configuration. Thus, the method MT will be described for designing one of the filters.

Figure 9:
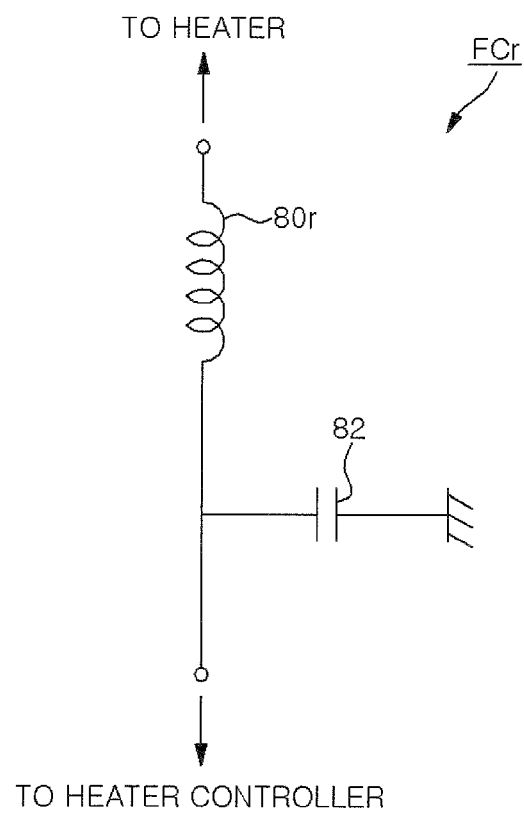
FIG. 9 shows a reference filter.
Figure 10:
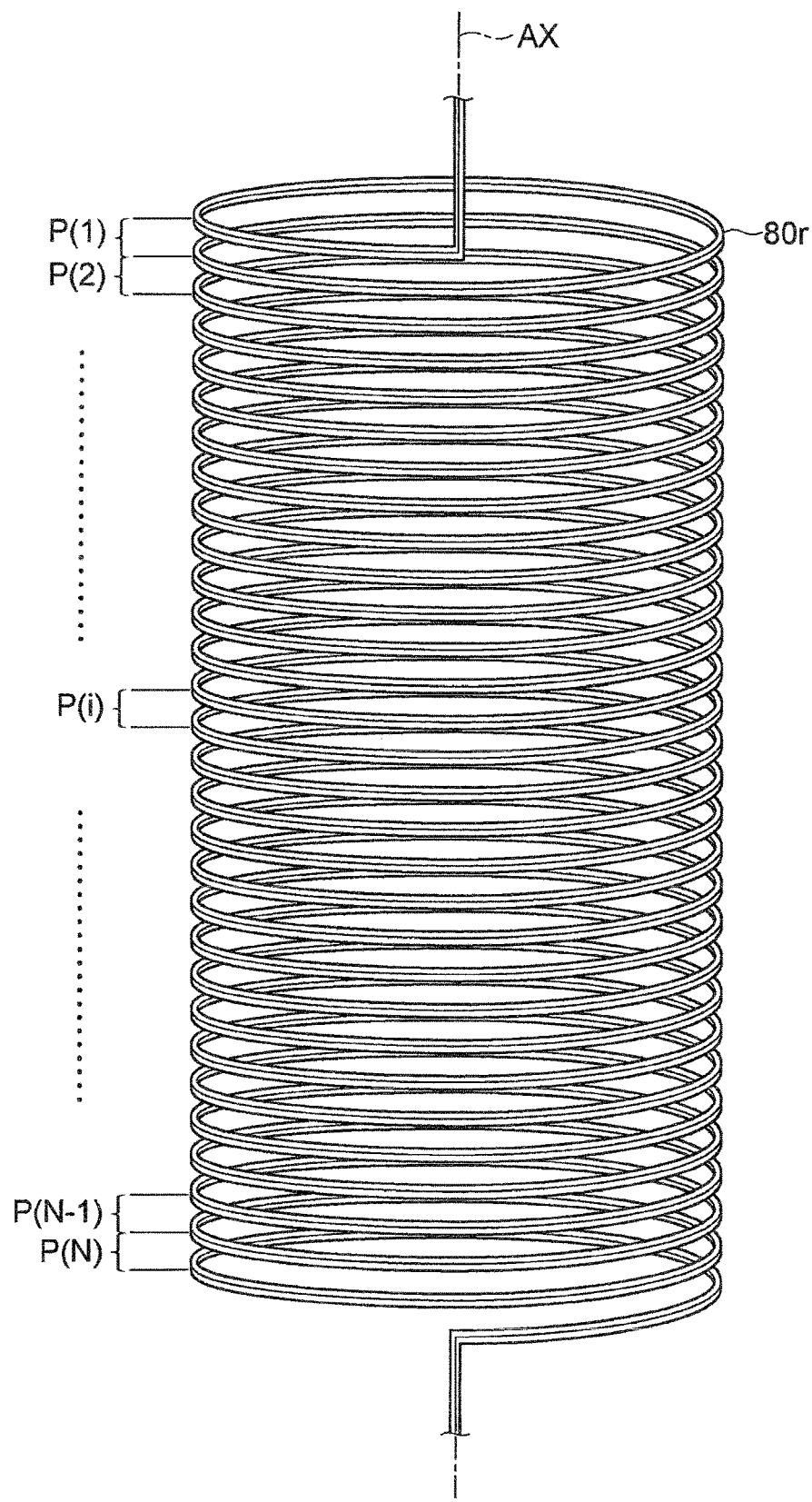
FIG. 10 shows a reference coil of the reference filter.

In the method MT, first, a reference filter FCr is designed in a step ST1. FIG. 9 shows the reference filter. FIG. 10 shows a reference coil of the reference filter. As shown in FIG. 9, a reference filter FCr is an LC filter and includes a reference coil 80r and a capacitor 82 connected in parallel to the reference coil 80r. As shown in FIG. 10, the reference coil 80r has windings wound around the axis AX in a screw shape. A plurality of pitches P(1) to P(N) provided in the axial direction (extension direction of the axis AX) by the windings of the reference coil 80r has the same length (reference length). N is an integer greater than 1 which indicates the number of pitches.

In the step ST1, the reference filter FCr is designed depending on a high frequency to be blocked (hereinafter, referred to as "usage frequency"). The reference filter FCr is an LC filter. Therefore, when an electrostatic capacity of the reference filter FCr is fixed, the inductance of the reference coil 80r is determined based on relationship of $f=1/(2\pi \sqrt{(LC)})$ depending on the usage frequency. Here, f may indicate the first-order resonance frequency. C indicates an electrostatic capacity of the reference filter FCr. L indicates an inductance of the reference coil 80r.

When the filter designed by the method MT is used as the filters of the filter unit in the plasma processing apparatus 10, the reference coil 80r is selected in the step ST1 depending on the usage frequency, the number of the filter devices FD, and a size of a space where the filter devices FD are provided. Specifically, the diameter of the reference coil 80, the number of turns, and an axial length of a gap between the windings are determined depending on the usage frequency, the number of the filter devices FD, and the size of the space where the filter devices FD are provided. In the plasma processing apparatus 10, a high Vpp (peak-to-peak voltage) is applied to the coil of the filter. Therefore, the axial length of the gap between the windings is determined such that a withstand voltage condition can be satisfied.

Next, in a step ST2, it is determined whether or not the characteristics of the reference filter FCr are optimal. For example, it is determined whether or not the reference filter FCr has an impedance required for the usage frequency, i.e., an impedance that satisfies specification. When it is determined that the characteristics of the reference filter FCr are optimal, e.g., when the reference filter FCr has an impedance required for the usage frequency, the method MT is completed and the same filter as the reference filter FCr is employed as the two filters of the filter unit FU. When it is determined that the characteristics of the reference filter FCr are not optimal, the method MT proceeds to a step ST3.

In the step ST3, a first difference Dif1 (absolute value) between a specific resonance frequency of the reference filter FCr and the usage frequency is obtained. Next, in a step ST4, it is determined whether or not the difference Dif1 is smaller than or equal to a predetermined value Th. When it is determined in the step ST4 that the difference Dif1 is smaller than or equal to the predetermined value Th, the method MT proceeds to a step ST5. On the other hand, when it is determined that the difference Dif1 is greater than the predetermined value Th, the method MT proceeds to a step ST6.

In the step ST5, one or more pitches to be changed in length among a plurality of pitches P(1) to P(N) of the reference coil 80r are determined to reduce the difference Dif1. In the step ST6, the position (split position) in the reference coil 80r where the reference coil 80r is divided into a first coil element and a second coil element connected in series and the distance (split distance) between the first coil element and the second coil element are determined. The variation of the specific resonance frequency of the reference filter FCr caused by changes in lengths of one or more pitches (variation ΔfP, see FIG. 8) is about 5 MHz at the most. Further, the variation of the specific resonance frequency of the reference filter FCr caused by the split of the reference coil 80r (variation ΔfD, see FIG. 8) is greater than 5 MHz. Therefore, the predetermined value Th is set to, e.g., about 5 MHz.

Figure 11:
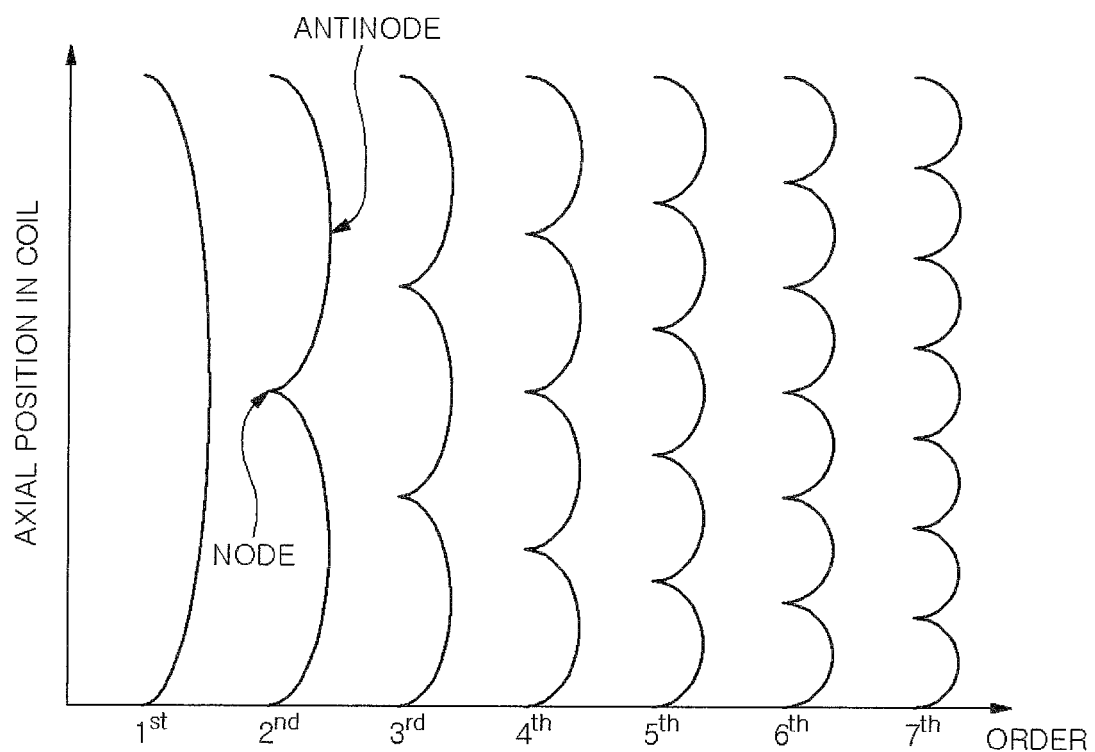
FIG. 11 explains a concept of relationship between a position of a coil in an axial direction and changes in a resonance frequency.

Here, a relationship between the position in the coil in the axial direction and the change in the resonance frequency will be described. FIG. 11 explains a concept of the relationship between the axial position in the coil and the change in the resonance frequency. In FIG. 11, there are illustrated waveforms having antinodes and nodes corresponding to orders of a plurality of resonance frequencies. In FIG. 11, vertical lengths of the waveforms of the respective orders correspond to an entire length of the coil. If the pitch of the coil can be increased at a position corresponding to an antinode of a waveform of each order illustrated in FIG. 11, a resonance frequency of a corresponding order is shifted toward a high frequency side. If the pitch of the coil can be increased at a position corresponding to a node of a waveform of each order illustrated in FIG. 11, a resonance frequency of a corresponding order is shifted toward a low frequency side. On the other hand, if the pitch of the coil can be reduced at a position corresponding to an antinode of a waveform of each order illustrated in FIG. 11, a resonance frequency of a corresponding order is shifted to the low frequency side. If the pitch of the coil can be reduced at a position corresponding to a node of a waveform of each order illustrated in FIG. 11, a resonance frequency of a corresponding order is shifted toward the high frequency side. For example, if the pitch of the coil can be increased at an intermediate position in the entire length of the coil, the second-order resonance frequency is shifted to the low frequency side as illustrated in FIG. 8. If the pitch of the coil can be reduced at the intermediate position in the entire length of the coil, the fourth-order and the sixth-order resonance frequency are shifted toward the low frequency side and the first-order, the third-order, the fifth-order and the seventh-order resonance frequency are shifted to the high frequency side.

In the same manner, if the coil is divided to two coil elements at a position corresponding to an antinode of a waveform of each order illustrated in FIG. 11, a resonance frequency of a corresponding order is shifted to the high frequency side. If the coil is divided into two coil elements at a position corresponding to a node of a waveform of each order illustrated in FIG. 11, a resonance frequency of a corresponding order is shifted to the low frequency side. For example, if the coil is divided into two coil elements at the intermediate position in the entire length of the coil, the second-order resonance frequency is shifted to the low frequency side as illustrated in FIG. 8. If the coil is divided into two coil elements at the intermediate position in the entire length of the coil, the fourth-order and the sixth-order resonance frequency are shifted to the low frequency side and the first-order, the third-order, the fifth-order and the seventh-order resonance frequency are shifted to the high frequency side.

Figure 12:
FIG. 12 shows an example of a table.

Referring back to FIG. 1, in the step ST5, one or more pitches to be changed in length among a plurality of pitches P(1) to P(N) of the reference coil 80r are determined based on the relationship described with reference to FIG. 11 in order to reduce the difference Dif1. In the step ST5 of one embodiment, one or more pitches to be changed in length are determined with reference to a table. FIG. 12 shows an example of the table. In the table TB shown in FIG. 12, the variations of a plurality of resonance frequencies are registered in association with pitch numbers (pitch No.) specifying orders of a plurality of pitches P(1) to P(N). In the example shown in FIG. 12, the variations of the first-order to the fourth-order resonance frequencies are registered in the table TB.

The table TB is prepared before the execution of the step ST5. Specifically, in preparing the table TB, while the pitches P(1) to P(N) of the reference coil 80r are individually changed in length with respect to the reference length, the variations of the individual resonance frequencies before and after changes in length of the pitches P(1) to P(N) are obtained and registered in the table TB. Accordingly, the table TB is prepared. The number of the table TB is not limited to one, and the table TB may be prepared for each variation of the length of the pitch with respect to the reference length.

In the step ST5 of one embodiment, one or more pitches to be changed in length among a plurality of pitches P(1) to P(N) are determined by referring to the prepared table TB to minimize the difference Dif1. In case where the table TB is prepared for each variation of the length of the pitch with respect to the reference length, the determination is made on one or more pitches to be changed in length among a plurality of pitches P(1) to P(N) together with the variation of the length of each of the selected one or more pitches to minimize the difference Dif1. When two or more pitches are changed in length among a plurality of pitches P(1) to P(N), the variations of the resonance frequencies of the respective orders are the sum of the variations of the resonance frequencies of the respective orders corresponding to the numbers specifying the two or more pitches changed in length in the table TB.

In one embodiment, the length of each of one or more pitches after the change is determined to satisfy the following Eq. (1):

$$\varphi \geq 4 \times L_P \qquad \text{Eq. (1).}$$

In Eq. (1), φ indicates a diameter of the reference coil 80r, and $L_P$ indicates the length of each of one or more pitches after the change.

When the relationship shown in Eq. (1) is not satisfied, a single resonance frequency before the change in one or more pitches may be changed to two resonance frequencies after the change. By satisfying the relationship shown in Eq. (1), stable frequency-impedance characteristics can be obtained.

In the step ST6, in order to reduce the difference Dif1, the split position in the reference coil 80r where the reference coil 80r is divided into a first coil element 84r and a second coil element 86r connected in series and the split distance between the first coil element 84r and the second coil element 86r are determined based on the relationship described with reference to FIG. 11. In one embodiment, the split position and the split distance are determined to minimize the difference Dif1 by using a prepared relationship of a plurality of resonance frequencies of the filter, which includes the first and the second coil element 84r and 86r connected in series and the capacitor connected in parallel to the first and the second coil element 84r and 86r, with respect to the position in the reference coil 80r where the reference coil 80 is divided into the first and the second coil element 84r and 86r and the distance between the first and the second coil element 84r and 86r.

Figure 13:
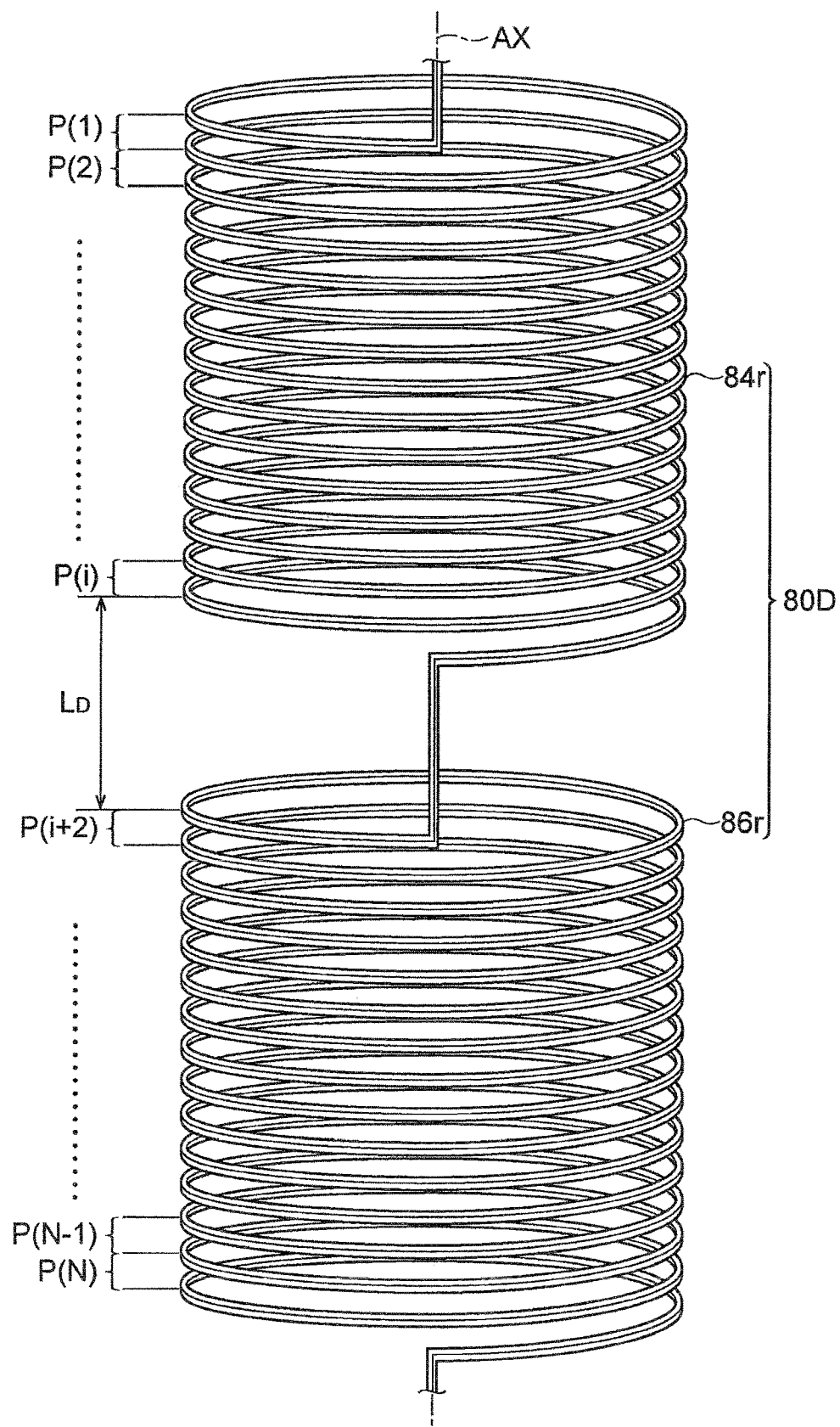
FIG. 13 shows a coil including a first coil element and a second coil element.

In one embodiment, the aforementioned prepared relationship used in the step ST6 is maintained as a prepared function F (m, $Z_D$, $L_D$). Here, m indicates an order of a resonance frequency. $Z_D$ indicates a position in the reference coil 80r where the reference coil 80r is divided into the first and the second coil element 84r and 86r. $L_D$ indicates a distance in an axial direction between the first and the second coil element 84r and 86r (see FIG. 13). An output of the function F (m, $Z_D$, $L_D$) is a resonance frequency of the filter (split filter) including the first and the second coil element 84r and 86r connected in series and the capacitor 82 connected in parallel to the first and the second coil element 84r and 86r and also a resonance frequency of an order m which corresponds to the case where the reference coil 80r is divided into the first and the second coil element 84r and 86r at a position $Z_D$ in the reference coil 80r and a distance $L_D$ exists between the first and the second coil element 84r and 86r.

In one embodiment, the function F (m, $Z_D$, $L_D$) may be a linear function as can be seen from the following Eq. (2):

$$F(m,Z_D,L_D)=a(m,Z_D) \times L_D + b(m,Z_D,L_D) \qquad \text{Eq. (2)}$$

In Eq. (2), 'a(m, $Z_D$)' is a constant indicating a slope of the linear function which depends on the order m and the position $Z_D$ and 'b(m, $Z_D$, $L_D$)' is a constant of a linear function which depends on the order m, the position $Z_D$, and the distance $L_D$.

In a step ST7 following the step ST6, it is determined whether or not the characteristics of the split filter including the first and the second coil element 84r and 86r and the capacitor 82 are optimal, the characteristics being set based on the split position and the split distance determined in the step ST6. For example, it is determined whether or not the split filter has an impedance required in the usage frequency. When it is determined that the characteristics of the split filter are optimal, e.g., when the split filter has an impedance required for the usage frequency, the method MT is completed and the filter same as the split filter is employed as the two filters of the filter unit FU. On the other hand, when it is determined that the characteristics of the split filter are not optimal, the method MT proceeds further to a step ST8.

In the step ST8, one or more pitches to be changed in length among a plurality of pitches of the coil (split coil 800) including the first and the second coil element 84r and 86r are determined in order to reduce a second difference between a specific resonance frequency of the split filter and the usage frequency. In the split coil 80D, pitches other than the pitch of the split position among a plurality of pitches of the reference coil 80r has been maintained. One or more pitches to be changed in length among a plurality of pitches of the split coil 80D are determined in the same manner as that in the step ST5. In one embodiment, in the step ST8, the table TB used in the step ST5 is used. After the execution of the step ST8, the method MT is completed. The same filter as the split filter designed in the step ST8 is employed as the two filters of the filter unit FU.

In accordance with the method MT described above, when the difference Dif1 between the resonance frequency of the reference filter FCr and the usage frequency is smaller than or equal to a predetermined value, one or more pitches suitable for reduction of the difference Dif1 are determined among a plurality of pitches of the reference coil 80r. Accordingly, as a filter having a coil of an irregular pitch, it becomes possible to design a filter whose specific resonance frequency has been finely adjusted on the basis of the reference filter FCr having the reference coil 80r of regular pitches. On the other hand, when the difference Dif1 is greater than the predetermined value, the split position and the split distance in the reference coil 80r, which are suitable for reduction of the difference Dif1, are determined. Therefore, it becomes possible to design the split filter having a coil whose specific resonance frequency has been remarkably adjusted on the basis of the reference filter FCr having the reference coil 80r of regular pitches. Accordingly, in accordance with the method MT, even if a large difference exists between the specific resonance frequency and a desired frequency (usage frequency), the difference can be reduced or eliminated.

Further, in accordance with the method MT, even if a small difference exists between the specific resonance frequency of the split filter and the usage frequency, the small difference can be reduced or eliminated by changing the lengths of one or more pitches among a plurality of pitches of the split coil 80D included in the split filter.

While the disclosure has been shown and described with respect to the embodiments, it will be understood by those skilled in the art that various changes and modifications may be made without departing from the scope of the disclosure as defined in the following claims.

What is claimed is:
1. A method for designing a filter, comprising:
obtaining a difference between a high frequency to be blocked and a resonance frequency of a distributed constant type reference filter, which includes a reference coil having windings wound at a plurality of pitches having the same length in an axial direction and a capacitor connected in parallel to the reference coil;

determining, when the difference is smaller than or equal to a predetermined value, one or more pitches to be changed in length, among the plurality of pitches, to reduce the difference; and determining, when the difference is greater than the predetermined value, a split position in the reference coil where the reference coil is divided into a first coil element and a second coil element connected in series and a split distance between the first coil element and the second coil element to reduce the difference.

2. The method of claim 1, wherein said one or more pitches are determined to minimize the difference by referring to a table in which variations of a plurality of resonance frequencies of the reference filter according to changes in length of the respective pitches are registered, and the split position and the split distance are determined to minimize the difference by using a prepared relationship of respective resonance frequencies of a filter, which includes the first coil element and the second coil element connected in series and the capacitor connected in parallel to the first coil element and the second coil element, with respect to a position in the reference coil where the reference coil is divided into the first coil element and the second coil element and a distance between the first coil element and the second coil element.

3. The method of claim 2, further comprising:

determining one or more other pitches to be changed in length, among a plurality of pitches in the axial direction provided by windings of a coil including the first coil element and the second coil element, to reduce an additional difference between the high frequency and a specific resonance frequency among the respective resonance frequencies of the filter, and said one or more other pitches are determined by referring to the table to minimize the additional difference.

4. The method of claim 3, wherein a high frequency power having the high frequency is supplied to a lower electrode of a mounting table of a plasma processing apparatus, and the filter designed by the method blocks the high frequency between a heater installed in the mounting table and a heater controller including a power supply connected to the heater.

5. The method of claim 2, wherein a high frequency power having the high frequency is supplied to a lower electrode of a mounting table of a plasma processing apparatus, and the filter designed by the method blocks the high frequency between a heater installed in the mounting table and a heater controller including a power supply connected to the heater.

6. The method of claim 1, further comprising:

determining one or more other pitches to be changed in length, among a plurality of pitches in the axial direction provided by windings of a coil including the first coil element and the second coil element, to reduce an additional difference between the high frequency and a resonance frequency of a filter including the first coil element and the second coil element connected in series and the capacitor connected in parallel to the first coil element and the second coil element.

7. The method of claim 6, wherein a high frequency power having the high frequency is supplied to a lower electrode of a mounting table of a plasma processing apparatus, and the filter designed by the method blocks the high frequency between a heater installed in the mounting table and a heater controller including a power supply connected to the heater.

8. The method of claim 1, wherein a high frequency power having the high frequency is supplied to a lower electrode of a mounting table of a plasma processing apparatus, and the filter designed by the method blocks the high frequency between a heater installed in the mounting table and a heater controller including a power supply connected to the heater.

* * * * *